(12) United States Patent
Chen

(10) Patent No.: US 6,659,632 B2
(45) Date of Patent: Dec. 9, 2003

(54) LIGHT EMITTING DIODE LAMP

(75) Inventor: Hsing Chen, Ju-Bei (TW)

(73) Assignee: Solidlite Corporation, Shin Chu (TW)

( * ) Notice: Subject to any disclaimer, the term of this patent is extended or adjusted under 35 U.S.C. 154(b) by 0 days.

(21) Appl. No.: 10/114,098

(22) Filed: Apr. 1, 2002

(65) Prior Publication Data

US 2003/0090910 A1 May 15, 2003

(30) Foreign Application Priority Data

Nov. 9, 2001 (TW) .......................................... 90127989 A

(51) Int. Cl.[7] .............................. F21V 21/00; F21V 7/04
(52) U.S. Cl. .................... 362/800; 362/252; 362/249
(58) Field of Search ................................ 362/800, 545, 362/249, 252; 313/500

(56) References Cited

U.S. PATENT DOCUMENTS

| | | | |
|---|---|---|---|
| 4,727,289 A | * | 2/1988 | Uchida ........................ 315/71 |
| 5,890,794 A | * | 4/1999 | Abtahi et al. ............... 362/294 |
| 6,220,722 B1 | * | 4/2001 | Begemann ................... 362/231 |
| 6,357,893 B1 | * | 3/2002 | Belliveau .................... 362/285 |
| 6,499,860 B2 | * | 12/2002 | Begemann ................... 362/230 |
| 6,502,956 B1 | * | 1/2003 | Wu ............................. 362/237 |
| 6,580,228 B1 | * | 6/2003 | Chen et al. .............. 315/185 R |

* cited by examiner

*Primary Examiner*—Alan Cariaso
*Assistant Examiner*—Jacob Y. Choi
(74) *Attorney, Agent, or Firm*—Pro-Techtor International Services

(57) ABSTRACT

A light emitting diode lamp includes multiple LED members, a plane circuit board, an LED fixing cover, a circuit board mounting seat, a drive circuit, and an LED lamp base having a bulb copper head. The plane circuit board is initially cut to form a multiple-ring shape. Then, the multiple LED members are arranged and soldered on the plane circuit board. Then, the circuit board mounting seat is mounted on the bottom of the plane circuit board, thereby forming a spatial shape having a convex arcuate face. Then, the plane circuit board and the circuit board mounting seat are mounted in the LED lamp base. Then, the LED fixing cover is mounted on the LED lamp base, thereby assembling the light emitting diode lamp which may be available for the present filament bulb seat.

10 Claims, 16 Drawing Sheets

LIGHT EMITTING DIODE LAMP

BACKGROUND OF THE INVENTION

1. Field of the Invention

The present invention relates to a light emitting diode lamp, and more particularly to a light emitting diode lamp that may be made easily, may be mass produced, and may increase the projecting angles of the light.

2. Description of the Related Art

A conventional light emitting diode lamp in accordance with the prior art shown in FIG. 1 comprises multiple LED members 2 for emitting light 12, an LED lamp base 13 having a bulb copper head 15, and electrodes 14. However, the multiple LED members 2 are located at the same plane, so that the projecting angle of the emitted light is limited, thereby decreasing the illuminance of the light.

SUMMARY OF THE INVENTION

The present invention has arisen to mitigate and/or obviate the disadvantage of the conventional light emitting diode lamp.

The primary objective of the present invention is to provide a light emitting diode lamp that may be made easily, may be mass produced, and may increase the projecting angles of the light.

Another objective of the present invention is to provide a light emitting diode lamp, wherein the LED members are positioned by the LED fixing cover that is made of a high light permeable material, thereby increasing the illuminance of the light.

A further objective of the present invention is to provide a light emitting diode lamp, wherein the circuit board mounting seat is mounted on the bottom of the plane circuit board to support the plane circuit board, thereby forming a spatial shape having a convex arcuate face.

A further objective of the present invention is to provide a light emitting diode lamp, wherein the bulb copper head is popular, so that the light emitting diode lamp may be available for the present filament bulb seat.

In accordance with one aspect of the present invention, there is provided a light emitting diode lamp, comprising multiple LED members, a plane circuit board, an LED fixing cover, a circuit board mounting seat, a drive circuit, and an LED lamp base having a bulb copper head, wherein:

the plane circuit board is initially cut, punched or sculptured to form a multiple-ring shape, then, the multiple LED members are arranged on the plane circuit board, and are automatically soldered by a tin furnace, then, the circuit board mounting seat is mounted on the bottom of the plane circuit board to support the plane circuit board, thereby forming a spatial shape having a convex arcuate face, then, the plane circuit board and the circuit board mounting seat are mounted in the LED lamp base, the multiple LED members are connected with each other, and are connected to the bulb copper head of the LED lamp base through the drive circuit, then, the LED fixing cover is mounted on the LED lamp base, thereby assembling the light emitting diode lamp which may be available for the present filament bulb seat, the LED fixing cover is mounted above the multiple LED members of the plane circuit board, for fixing the positions and projecting angles of the multiple LED members of the plane circuit board 1.

Preferably, the multiple LED members of the plane circuit board may use any color and any LED seal package state member, such as SMD type, Lamp type or the like.

Preferably, the multiple LED members are arranged in the straddling or non-straddling cutting channels of the plane circuit board in an annular manner.

Preferably, the circuit board mounting seat is made of material having a high heat conductive property, such as copper, aluminum or the like, thereby enhancing the heat dissipation efficiency, or made of insulating material having a high heat conductive property.

Preferably, the multiple LED members may form a convex arcuate face or press the plane circuit board outward so that the plane circuit board may form a spatial shape having a concave arcuate face, thereby forming a light emitting diode lamp that has a light gathering effect.

Preferably, the plane circuit board is cut to form a multiple-ring shape, including a helical shape, a concentric shape or a concentric circle connected with multiple inclined sides.

Preferably, the plane circuit board may also be cut to form a multiple-square shape or a multiple-polygon shape, including a hexagonal shape or octagonal shape.

Preferably, the LED fixing cover is made of a high light permeable material, such as PC, PMMA or the like, thereby increasing the illuminance of the light.

Preferably, the LED fixing cover is formed with multiple positioning holes for passage and protruding of the multiple LED members of the plane circuit board, the positioning holes of the LED fixing cover are not penetrated, and the LED fixing cover and the LED lamp base are made of waterproof material, thereby forming a waterproof a light emitting diode lamp.

Preferably, the plane circuit board may be a flexible circuit board.

Further benefits and advantages of the present invention will become apparent after a careful reading of the detailed description with appropriate reference to the accompanying drawings.

DETAILED DESCRIPTION OF THE INVENTION

Figure 1:
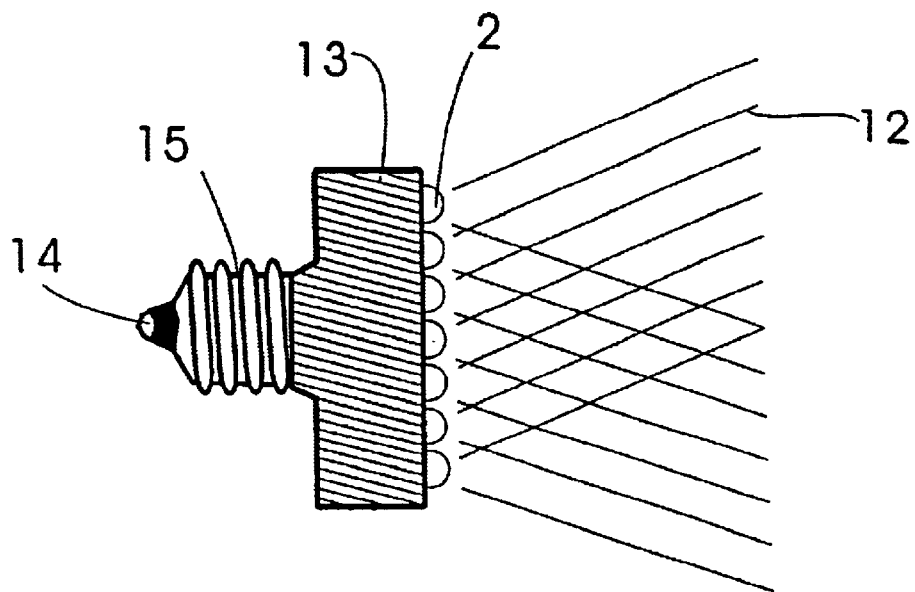
FIG. 1 is a side plan cross-sectional assembly view of a conventional light emitting diode lamp in accordance with the prior art.

Referring to the drawings and initially to FIGS. 2–7, a light emitting diode lamp in accordance with a first embodiment of the present invention is shown.

Figure 2:
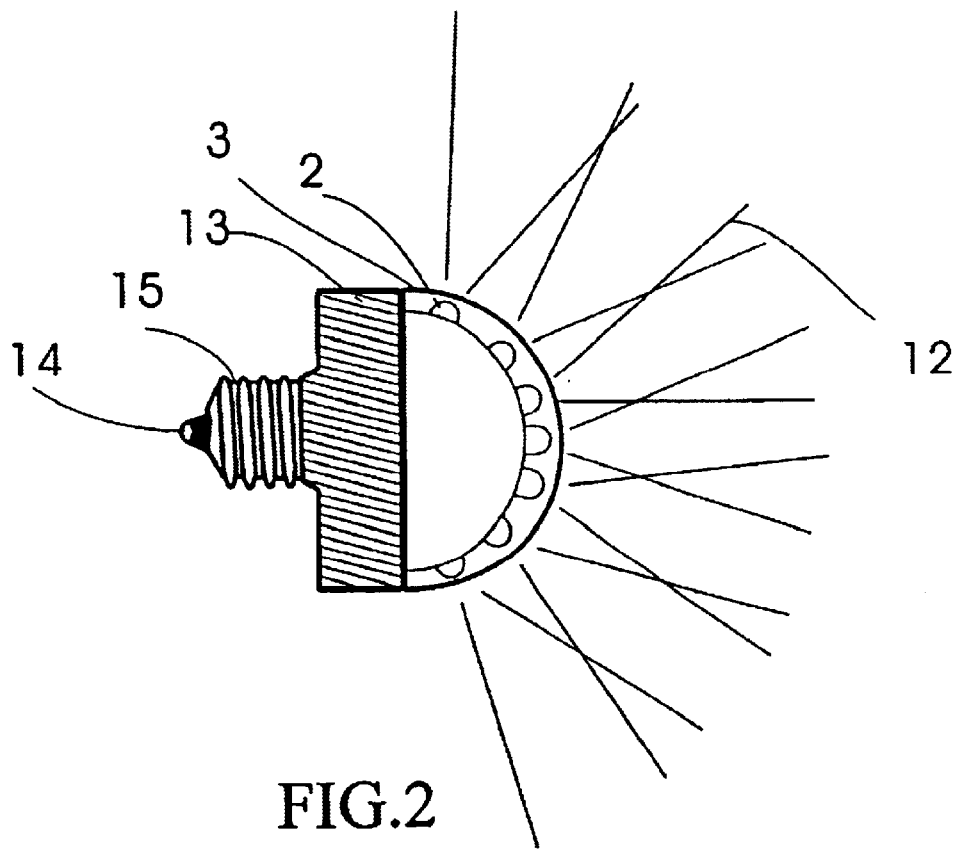
FIG. 2 is a side plan cross-sectional assembly view of a light emitting diode lamp in accordance with the present invention.
Figure 3:
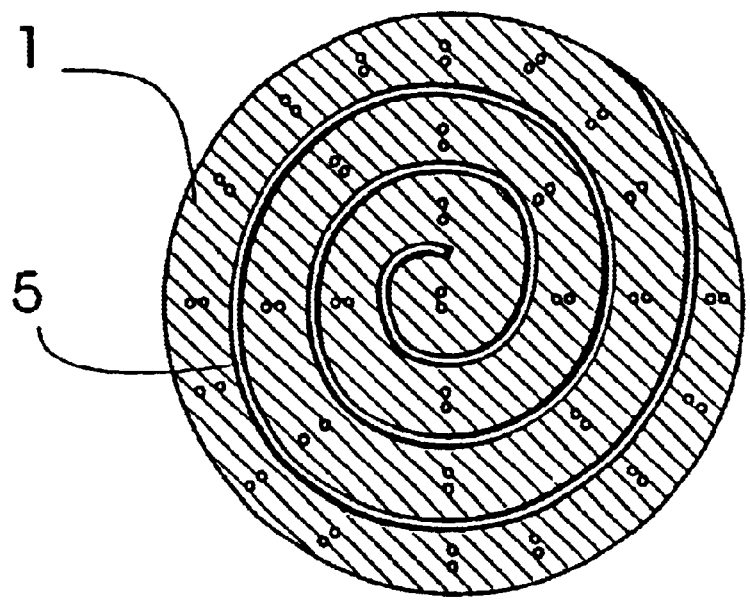
FIG. 3 is a front plan cross-sectional view of a plane circuit board of the light emitting diode lamp in accordance with a first embodiment of the present invention (helical)
Figure 4:
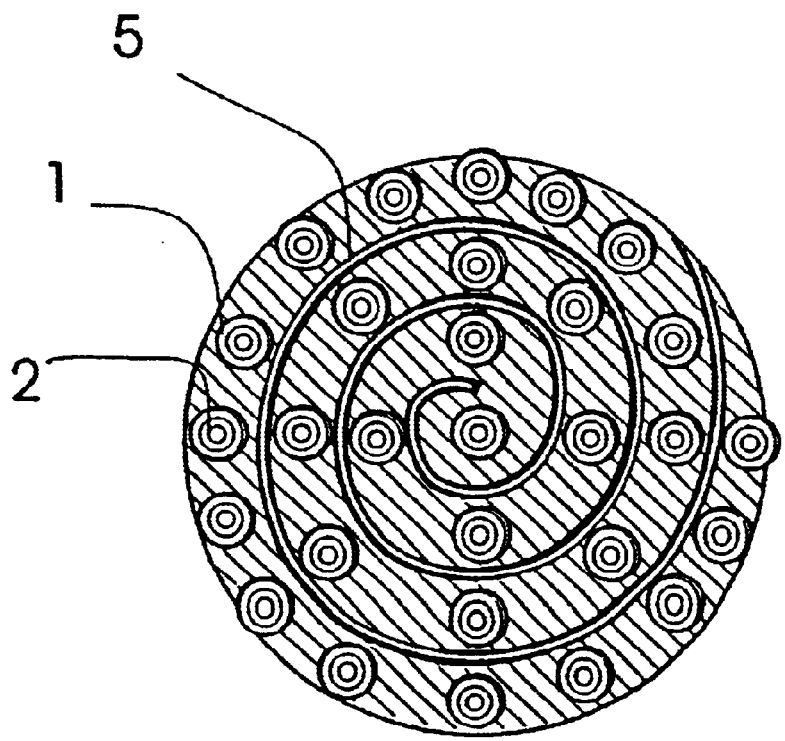
FIG. 4 is a front plan cross-sectional view of a plane circuit board and multiple light emitting diodes of the light emitting diode lamp in accordance with a first embodiment of the present invention (helical)
Figure 5:
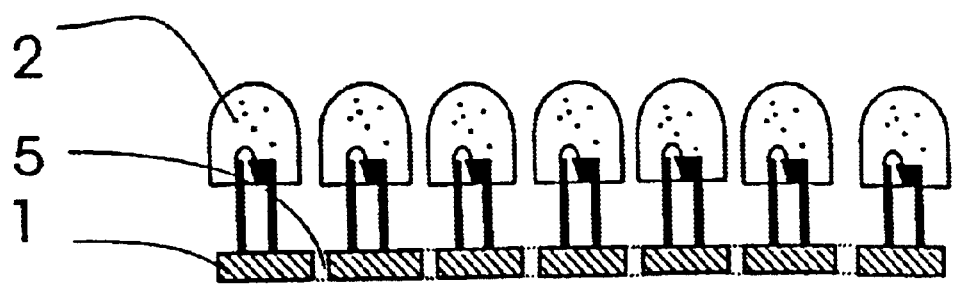
FIG. 5 is a side plan cross-sectional view of a plane circuit board and multiple light emitting diodes of the light emitting diode lamp in accordance with a first embodiment of the present invention (helical)
Figure 6:
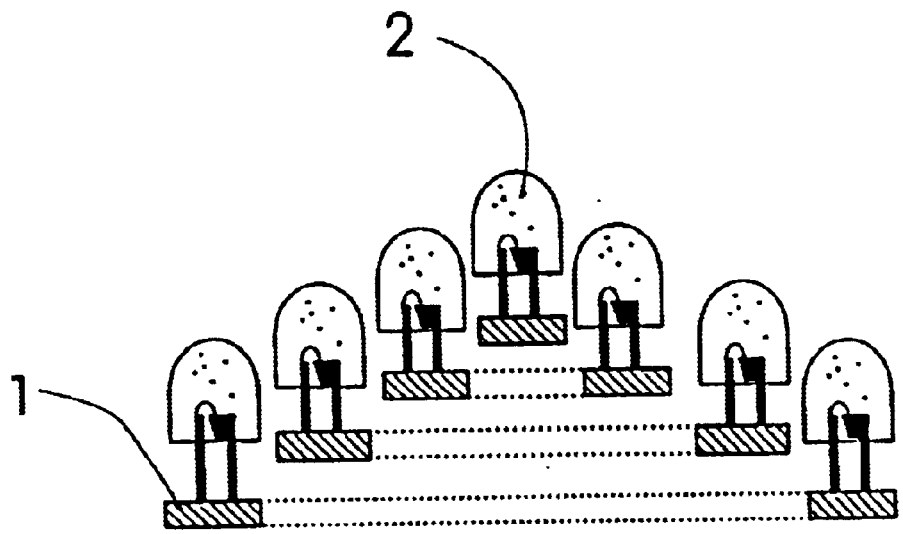
FIG. 6 is a side plan cross-sectional view of a plane circuit board and multiple light emitting diodes of the light emitting diode lamp in accordance with a first embodiment of the present invention (helical)
Figure 7:
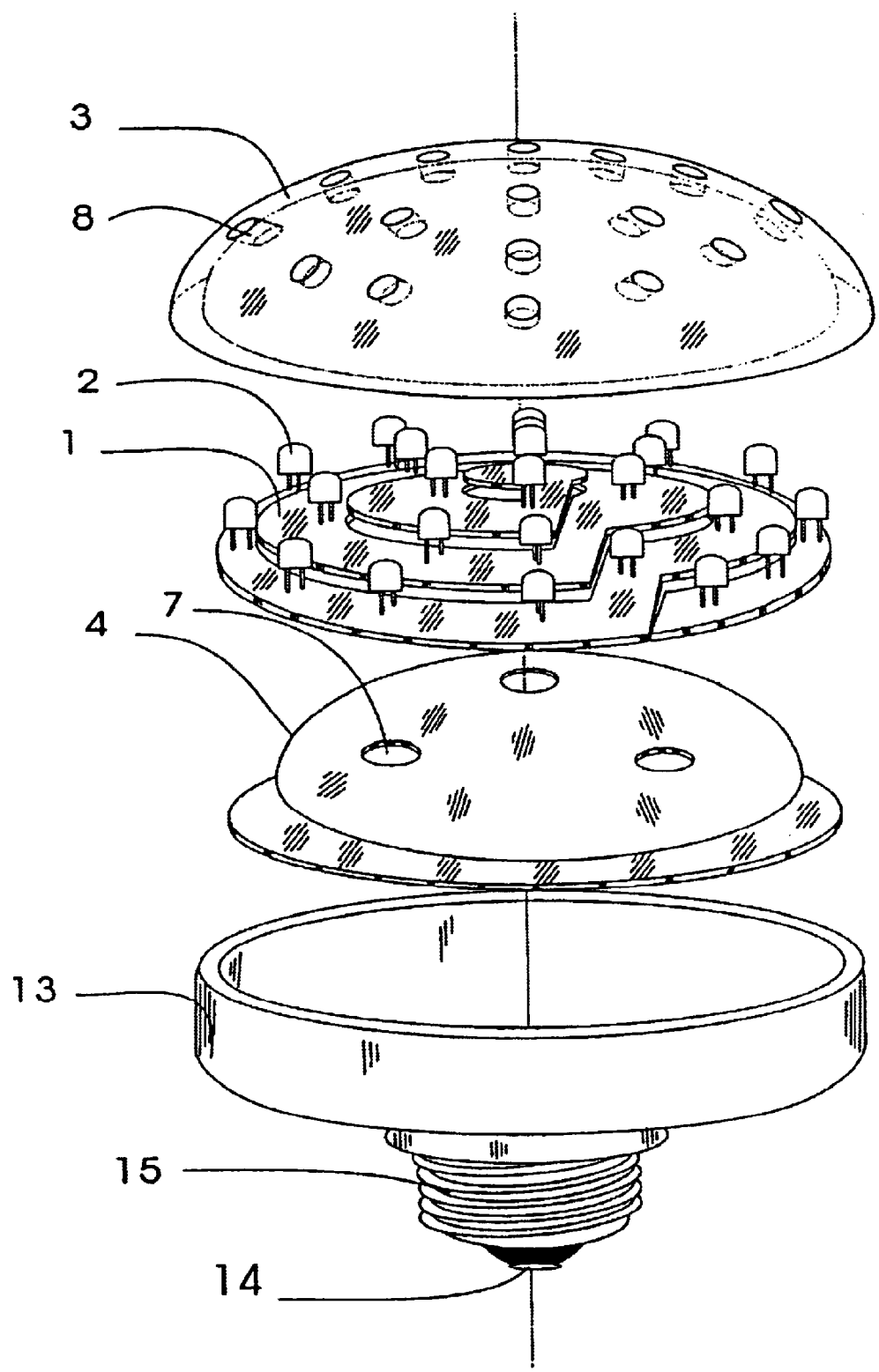
FIG. 7 is an exploded perspective view of a light emitting diode lamp in accordance with a first embodiment of the present invention (helical and non-straddling)

FIG. 2 is a side plan cross-sectional assembly view of a light emitting diode lamp in accordance with the present invention. FIG. 3 is a front plan cross-sectional view of a plane circuit board of the light emitting diode lamp in accordance with a first embodiment of the present invention (helical). FIG. 4 is a front plan cross-sectional view of a plane circuit board and multiple light emitting diodes of the light emitting diode lamp in accordance with a first embodiment of the present invention (helical). FIG. 5 is a side plan cross-sectional view of a plane circuit board and multiple light emitting diodes of the light emitting diode lamp in accordance with a first embodiment of the present invention (helical). FIG. 6 is a side plan cross-sectional view of a plane circuit board and multiple light emitting diodes of the light emitting diode lamp in accordance with a first embodiment of the present invention (helical). FIG. 7 is an exploded perspective view of a light emitting diode lamp in accordance with a first embodiment of the present invention (helical and non-straddling).

The light emitting diode (LED) lamp in accordance with a first embodiment of the present invention comprises multiple LED members 2 for emitting light 12, a plane circuit board 1, an LED fixing cover 3, a circuit board mounting seat 4, a drive circuit 11 (see FIG. 23), and an LED lamp base 13 having a bulb copper head 15.

Figure 24:
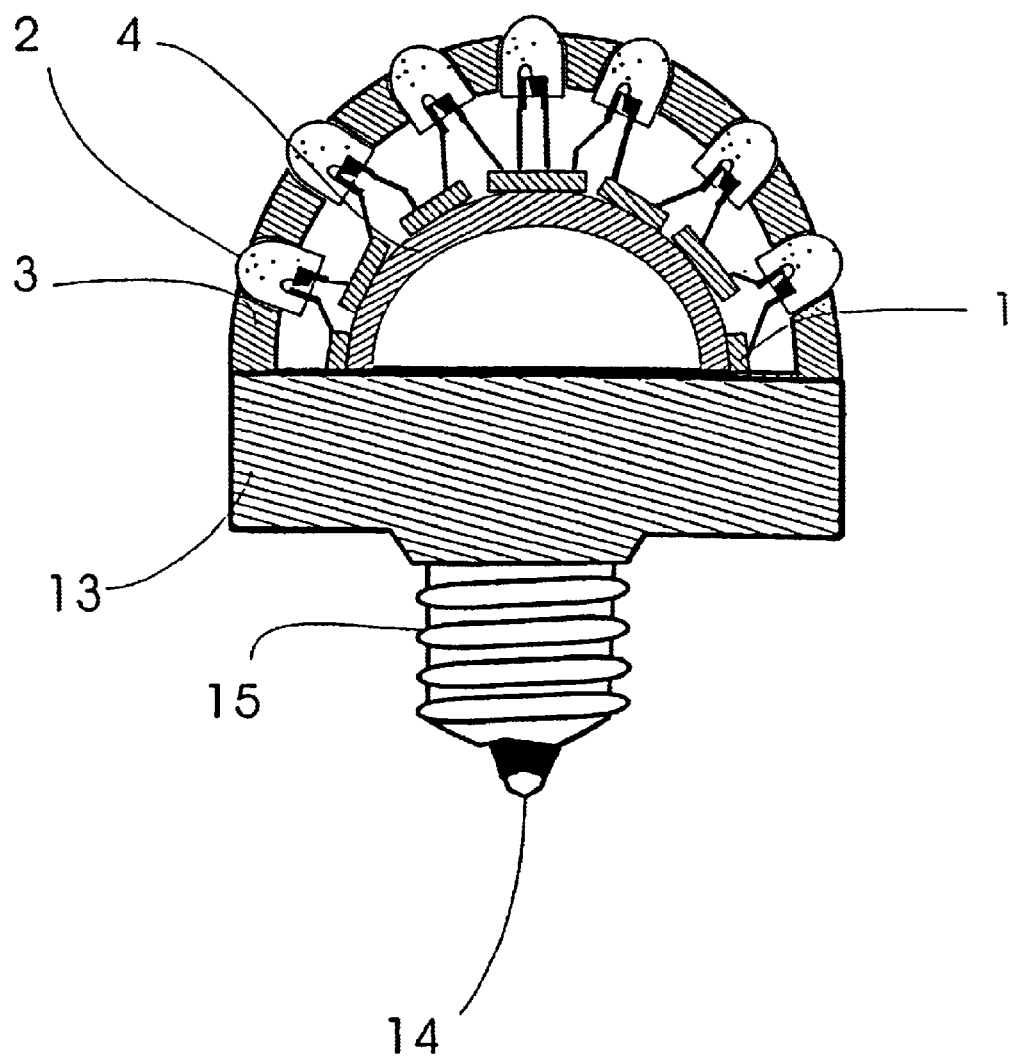
FIG. 24 is a side plan cross-sectional assembly view of the light emitting diode lamp in accordance with the present invention (the positioning hoes of the LED member is penetrated)

The plane circuit board 1 is initially cut, punched or sculptured to form a helical multiple-ring shape as shown in FIG. 3. Then, the multiple LED members 2 are symmetrically arranged on the plane circuit board 1 as shown in FIG. 4, and are automatically soldered by a tin furnace. Then, the plane circuit board 1 is pull to have an arcuate shape as shown in FIGS. 5 and 6. Then, the circuit board mounting seat 4 is mounted on the bottom of the plane circuit board 1 as shown in FIG. 7 to support the plane circuit board 1, thereby forming a spatial shape having a convex arcuate face. Then, the plane circuit board 1 and the circuit board mounting seat 4 are mounted in the LED lamp base 13. The LED fixing cover 3 is formed with multiple positioning holes 8 for passage and protruding of the multiple LED members 2 of the plane circuit board 1. The wires passes through the mounting holes 7 in the circuit board mounting seat 4 and are connected with the bulb copper head 15 and electrodes of the LED lamp base 13. The multiple LED members 2 are connected with each other, and are connected to the bulb copper head 15 of the LED lamp base 13 through the drive circuit 11. Then, the LED fixing cover 3 is mounted on the LED lamp base 13, so that the multiple LED members 2 are fixed in the positioning holes 8 of the LED fixing cover 3, thereby assembling the light emitting diode lamp as shown in FIG. 24 in accordance with the present invention. Thus, the light emitting diode lamp in accordance with the present invention may be available for the present filament bulb seat.

Referring to FIGS. 8–12, a light emitting diode lamp in accordance with a second embodiment of the present invention is shown.

Figure 8:
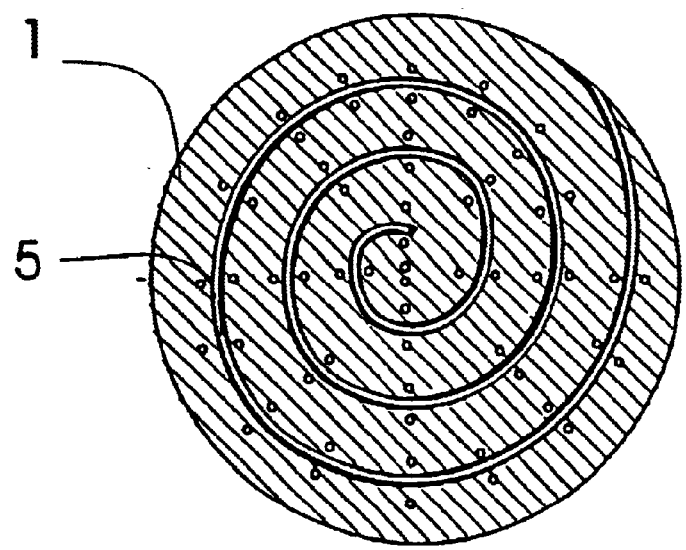
FIG. 8 is a front plan cross-sectional view of a plane circuit board of the light emitting diode lamp in accordance with a second embodiment of the present invention (helical)
Figure 9:
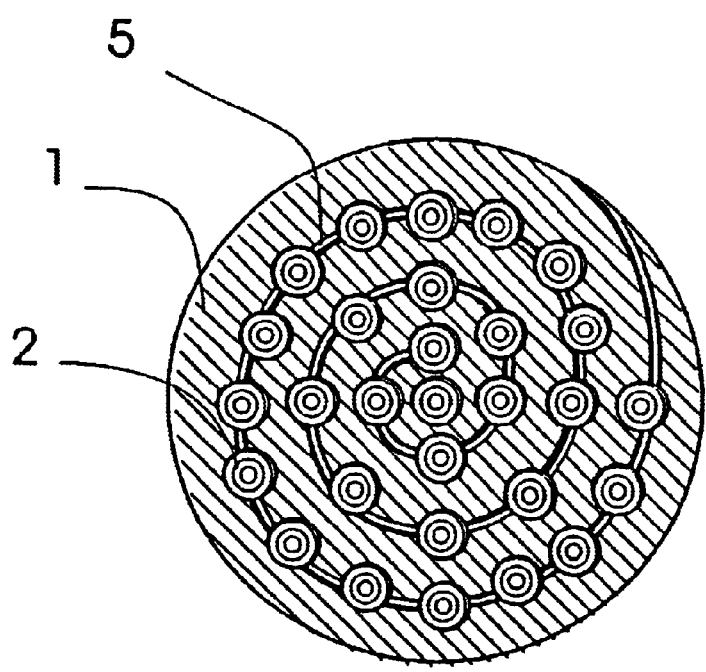
FIG. 9 is a front plan cross-sectional view of a plane circuit board and multiple light emitting diodes of the light emitting diode lamp in accordance with a second embodiment of the present invention (helical)
Figure 10:
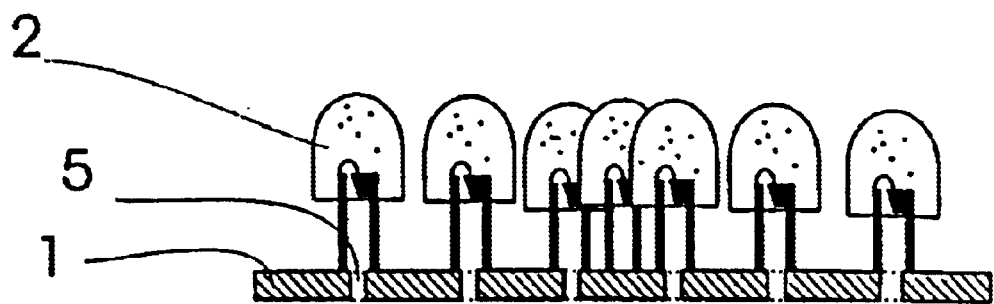
FIG. 10 is a side plan cross-sectional view of a plane circuit board and multiple light emitting diodes of the light emitting diode lamp in accordance with a second embodiment of the present invention (helical)
Figure 11:
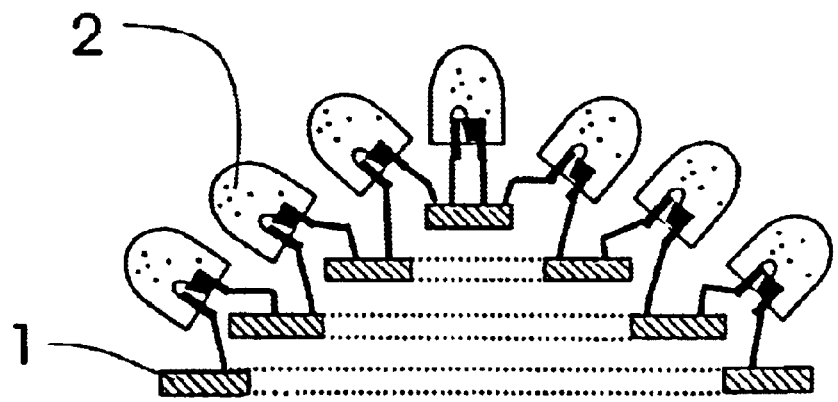
FIG. 11 is a side plan cross-sectional view of a plane circuit board and multiple light emitting diodes of the light emitting diode lamp in accordance with a second embodiment of the present invention (helical)
Figure 12:
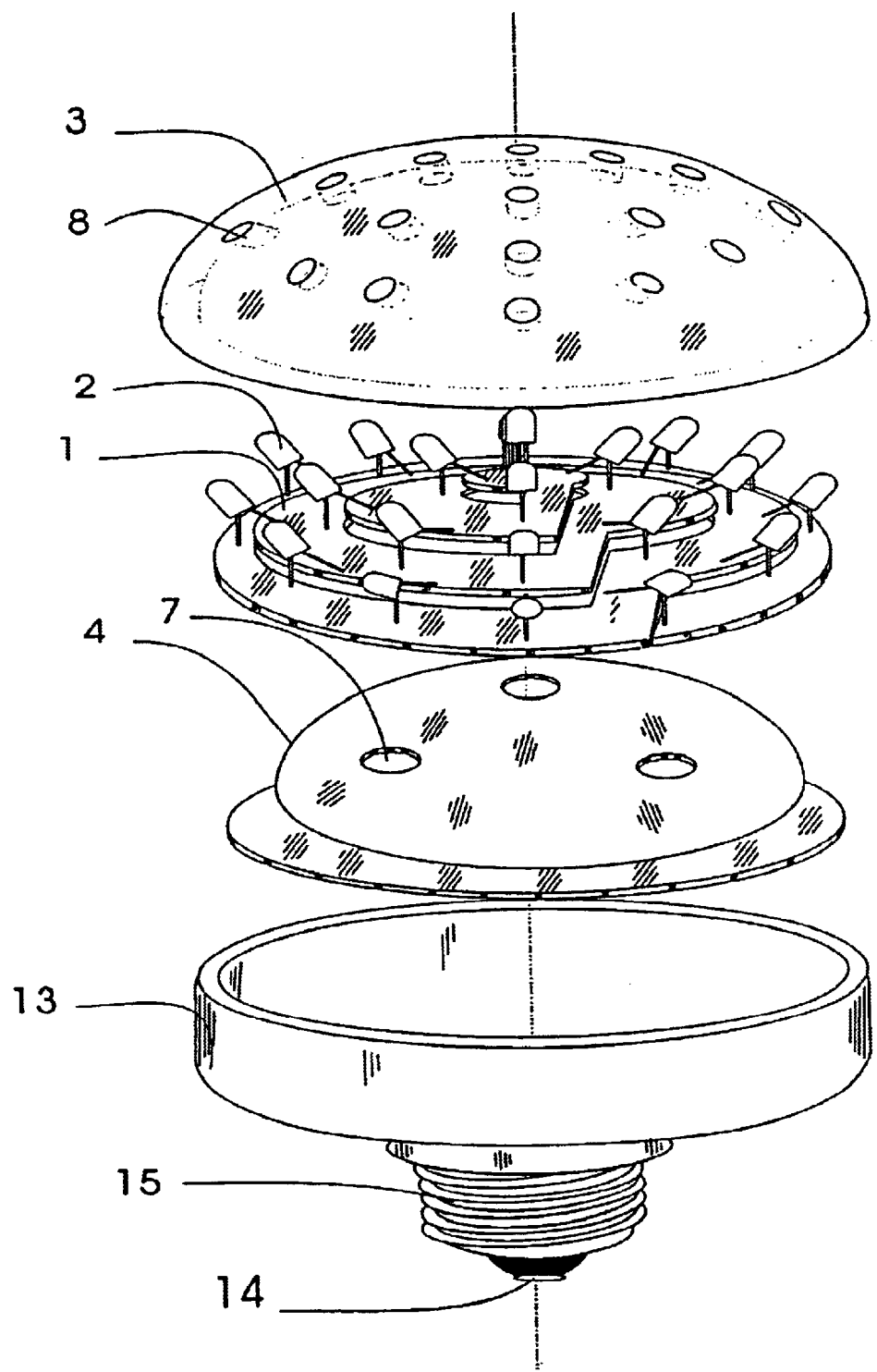
FIG. 12 is an exploded perspective view of a light emitting diode lamp in accordance with a second embodiment of the present invention (helically straddling)

FIG. 8 is a front plan cross-sectional view of a plane circuit board of the light emitting diode lamp in accordance with a second embodiment of the present invention (helical). FIG. 9 is a front plan cross-sectional view of a plane circuit board and multiple light emitting diodes of the light emitting diode lamp in accordance with a second embodiment of the present invention (helical). FIG. 10 is a side plan cross-sectional view of a plane circuit board and multiple light emitting diodes of the light emitting diode lamp in accordance with a second embodiment of the present invention (helical). FIG. 11 is a side plan cross-sectional view of a plane circuit board and multiple light emitting diodes of the light emitting diode lamp in accordance with a second embodiment of the present invention (helical). FIG. 12 is an exploded perspective view of a light emitting diode lamp in accordance with a second embodiment of the present invention (helically straddling).

The plane circuit board 1 is initially cut, punched or sculptured to form a helical multiple-ring shape as shown in FIG. 8. Then, the multiple LED members 2 are symmetrically arranged in the cutting slots 5 of the plane circuit board 1 as shown in FIG. 9, and are automatically soldered by a tin furnace. Then, the plane circuit board 1 is pull to have an arcuate shape as shown in FIGS. 10 and 11. Then, the circuit board mounting seat 4 is mounted on the bottom of the plane circuit board 1 as shown in FIG. 12 to support the plane circuit board 1, thereby forming a spatial shape having a convex arcuate face. Then, the plane circuit board 1 and the circuit board mounting seat 4 are mounted in the LED lamp base 13. The wires passes through the mounting holes 7 in the circuit board mounting seat 4 and are connected with the bulb copper head 15 and electrodes of the LED lamp base 13. The multiple LED members 2 are connected with each other, and are connected to the bulb copper head 15 of the LED lamp base 13 through the drive circuit 11. Then, the LED fixing cover 3 is mounted on the LED lamp base 13, so that the multiple LED members 2 are fixed in the positioning holes 8 of the LED fixing cover 3, thereby assembling the light emitting diode lamp as shown in FIG. 24 in accordance with the present invention. Thus, the light emitting diode lamp in accordance with the present invention may be available for the present filament bulb seat.

Referring to FIGS. 13–17, a light emitting diode lamp in accordance with a third embodiment of the present invention is shown.

Figure 13:
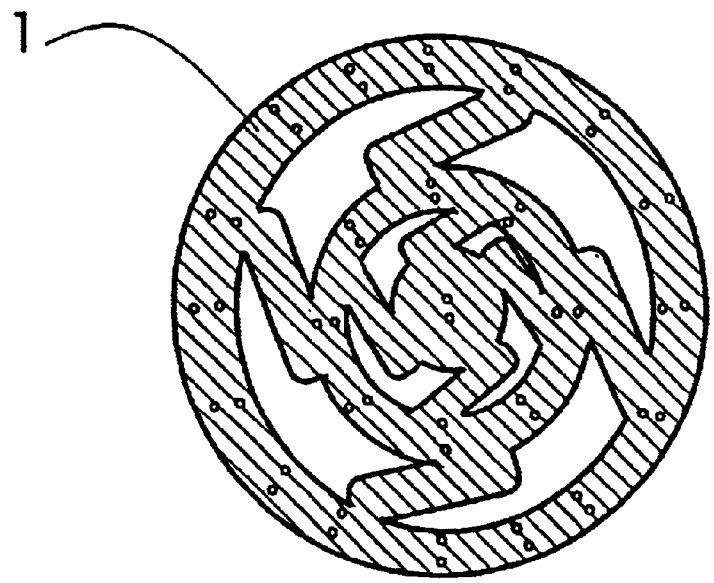
FIG. 13 is a front plan cross-sectional view of a plane circuit board of the light emitting diode lamp in accordance with a third embodiment of the present invention (a concentric circle connected with inclined sides)
Figure 14:
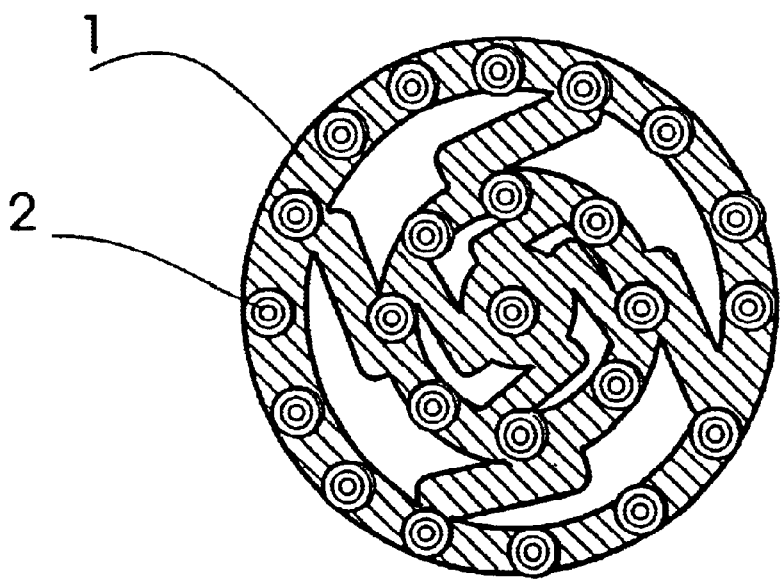
FIG. 14 is a front plan cross-sectional view of a plane circuit board and multiple light emitting diodes of the light emitting diode lamp in accordance with a third embodiment of the present invention (a concentric circle connected with inclined sides)
Figure 15:
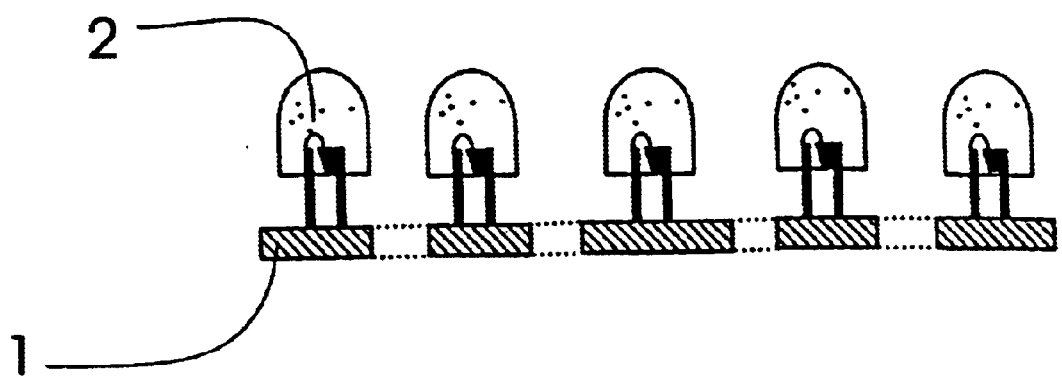
FIG. 15 is a side plan cross-sectional view of a plane circuit board and multiple light emitting diodes of the light emitting diode lamp in accordance with a third embodiment of the present invention (a concentric circle connected with inclined sides)
Figure 16:
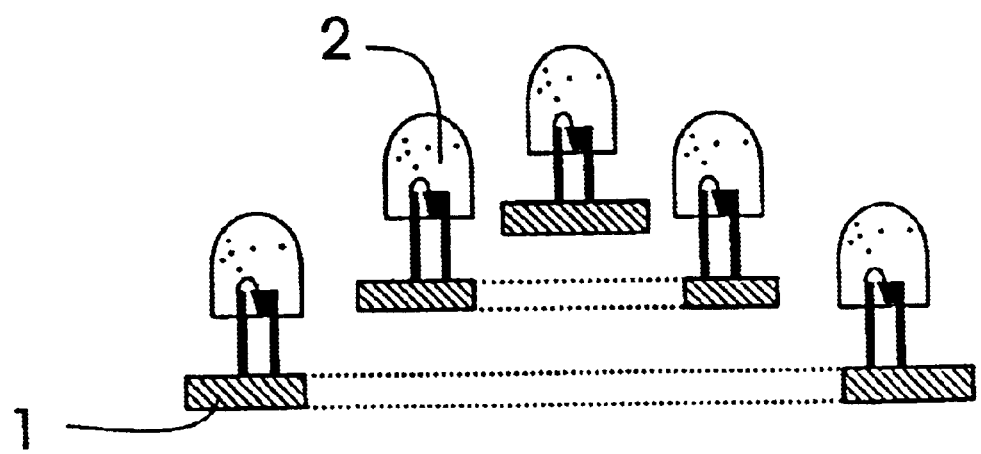
FIG. 16 is a side plan cross-sectional view of a plane circuit board and multiple light emitting diodes of the light emitting diode lamp in accordance with a third embodiment of the present invention (a concentric circle connected with inclined sides)
Figure 17:
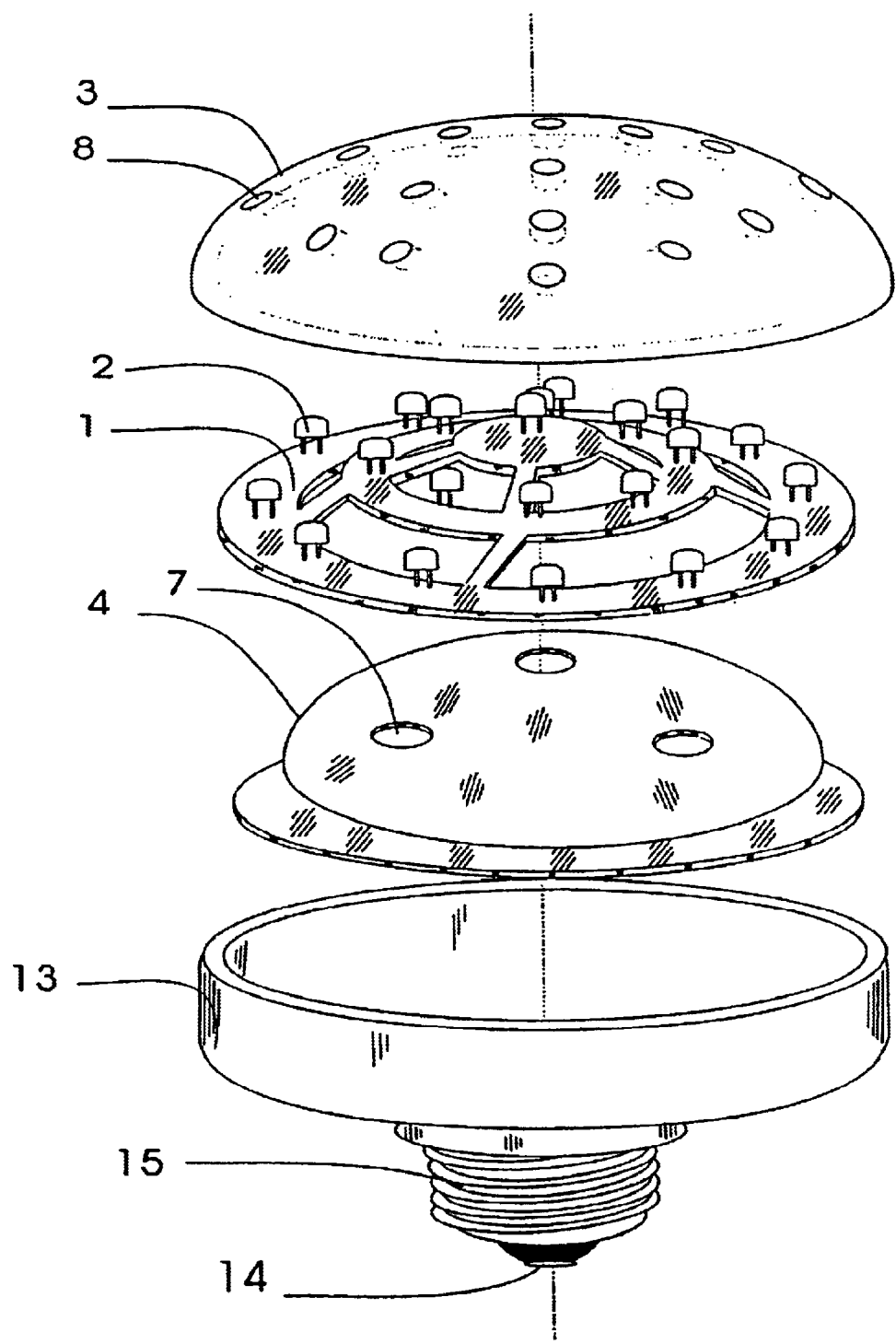
FIG. 17 is an exploded perspective view of a light emitting diode lamp in accordance with a third embodiment of the present invention (a concentric circle connected with inclined sides)

FIG. 13 is a front plan cross-sectional view of a plane circuit board of the light emitting diode lamp in accordance with a third embodiment of the present invention (a concentric circle connected with inclined sides). FIG. 14 is a front plan cross-sectional view of a plane circuit board and multiple light emitting diodes of the light emitting diode lamp in accordance with a third embodiment of the present invention (a concentric circle connected with inclined sides). FIG. 15 is a side plan cross-sectional view of a plane circuit board and multiple light emitting diodes of the light emitting diode lamp in accordance with a third embodiment of the present invention (a concentric circle connected with inclined sides). FIG. 16 is a side plan cross-sectional view of a plane circuit board and multiple light emitting diodes of the light emitting diode lamp in accordance with a third embodiment of the present invention (a concentric circle connected with inclined sides). FIG. 17 is an exploded perspective view of a light emitting diode lamp in accordance with a third embodiment of the present invention (a concentric circle connected with inclined sides).

The plane circuit board 1 is initially cut, punched or sculptured to form a shape of a concentric circle connected with inclined sides as shown in FIG. 13. Then, the multiple LED members 2 are symmetrically arranged on the plane circuit board 1 as shown in FIG. 14, and are automatically soldered by a tin furnace. Then, the plane circuit board 1 is pull to have an arcuate shape as shown in FIGS. 15 and 16. Then, the circuit board mounting seat 4 is mounted on the bottom of the plane circuit board 1 as shown in FIG. 17 to support the plane circuit board 1, thereby forming a spatial shape having a convex arcuate face. Then, the plane circuit board 1 and the circuit board mounting seat 4 are mounted in the LED lamp base 13. The wires passes through the mounting holes 7 in the circuit board mounting seat 4 and are connected with the bulb copper head 15 and electrodes of the LED lamp base 13. The multiple LED members 2 are connected with each other, and are connected to the bulb copper head 15 of the LED lamp base 13 through the drive circuit 11. Then, the LED fixing cover 3 is mounted on the LED lamp base 13, so that the multiple LED members 2 are fixed in the positioning holes 8 of the LED fixing cover 3, thereby assembling the light emitting diode lamp as shown in FIG. 24 in accordance with the present invention. Thus, the light emitting diode lamp in accordance with the present invention may be available for the present filament bulb seat.

Referring to FIGS. 18–22, a light emitting diode lamp in accordance with a fourth embodiment of the present invention is shown.

Figure 18:
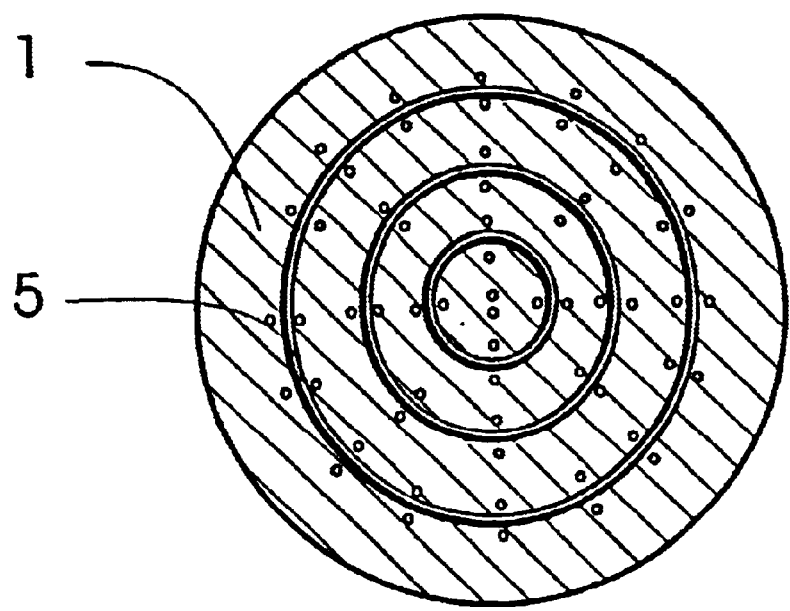
FIG. 18 is a front plan cross-sectional view of a plane circuit board of the light emitting diode lamp in accordance with a fourth embodiment of the present invention (a concentric circle)
Figure 19:
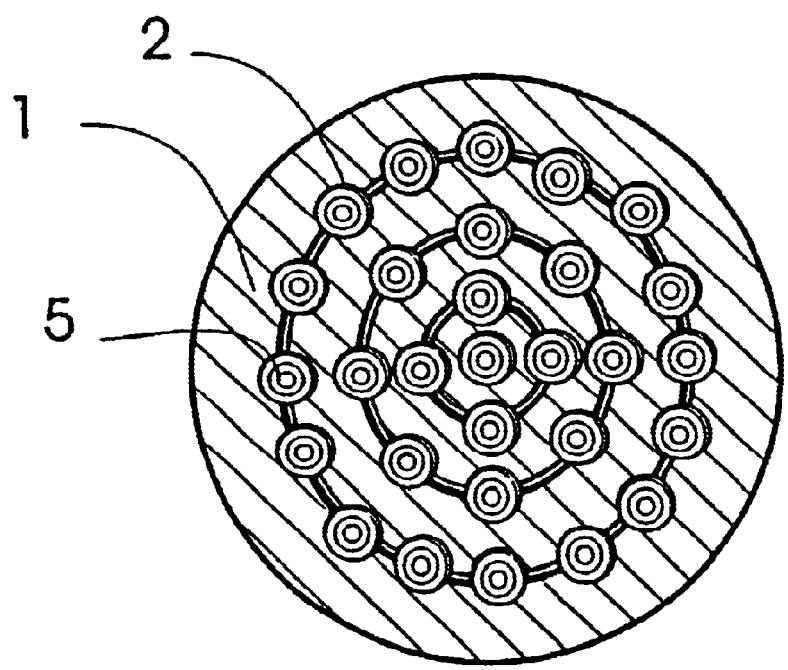
FIG. 19 is a front plan cross-sectional view of a plane circuit board and multiple light emitting diodes of the light emitting diode lamp in accordance with a fourth embodiment of the present invention (a concentric circle)
Figure 20:
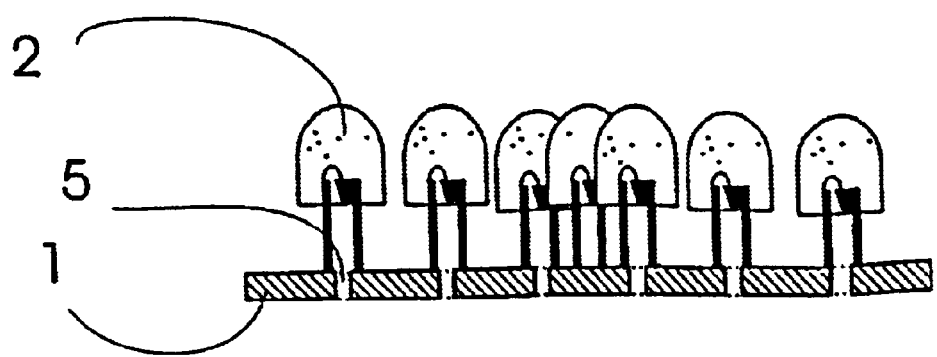
FIG. 20 is a side plan cross-sectional view of a plane circuit board and multiple light emitting diodes of the light emitting diode lamp in accordance with a fourth embodiment of the present invention (a concentric circle)
Figure 21:
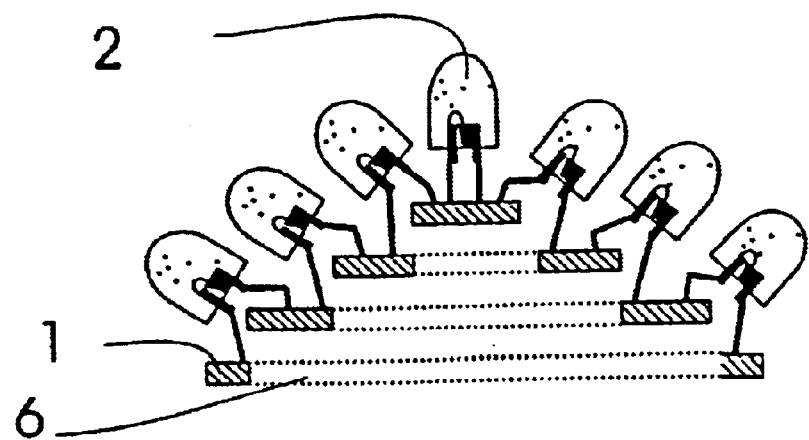
FIG. 21 is a side plan cross-sectional view of a plane circuit board and multiple light emitting diodes of the light emitting diode lamp in accordance with a fourth embodiment of the present invention (a concentric circle)
Figure 22:
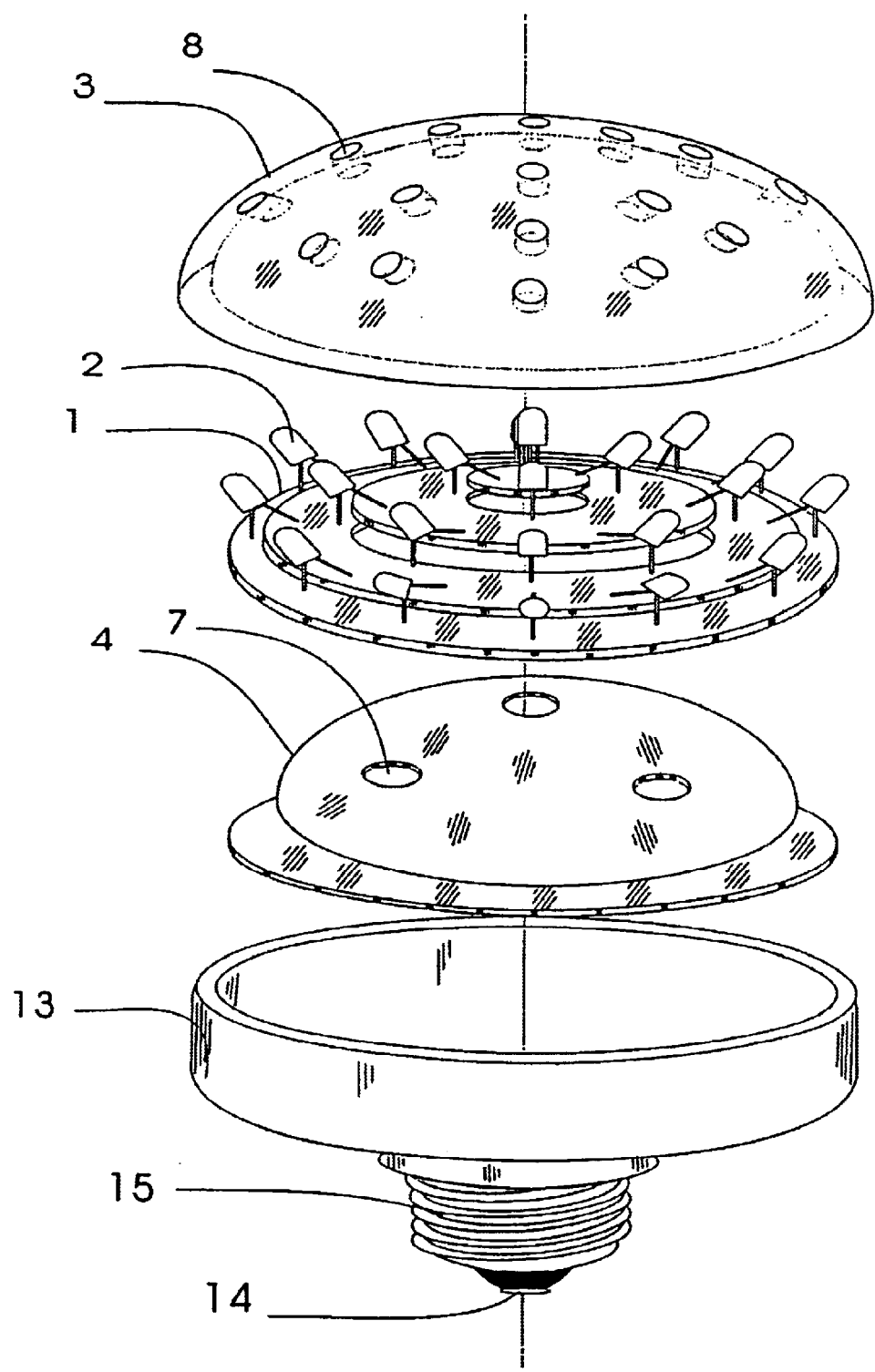
FIG. 22 is an exploded perspective view of a light emitting diode lamp in accordance with a fourth embodiment of the present invention (a concentric circle)

FIG. 18 is a front plan cross-sectional view of a plane circuit board of the light emitting diode lamp in accordance with a fourth embodiment of the present invention (a concentric circle). FIG. 19 is a front plan cross-sectional view of a plane circuit board and multiple light emitting diodes of the light emitting diode lamp in accordance with a fourth embodiment of the present invention (a concentric circle). FIG. 20 is a side plan cross-sectional view of a plane circuit board and multiple light emitting diodes of the light emitting diode lamp in accordance with a fourth embodiment of the present invention (a concentric circle). FIG. 21 is a side plan cross-sectional view of a plane circuit board and multiple light emitting diodes of the light emitting diode lamp in accordance with a fourth embodiment of the present invention (a concentric circle). FIG. 22 is an exploded perspective view of a light emitting diode lamp in accordance with a fourth embodiment of the present invention (a concentric circle).

The plane circuit board 1 is initially cut, punched or sculptured to form a shape of a concentric circle as shown in FIG. 18. Then, the multiple LED members 2 are symmetrically arranged on the plane circuit board 1 as shown in FIG. 19, and are automatically soldered by a tin furnace. Then, the plane circuit board 1 is pull to have an arcuate shape as shown in FIGS. 20 and 21. Then, the circuit board mounting seat 4 is mounted on the bottom of the plane circuit board 1 as shown in FIG. 22 to support the plane circuit board 1, thereby forming a spatial shape having a convex arcuate face. Then, the plane circuit board 1 and the circuit board mounting seat 4 are mounted in the LED lamp base 13. The wires passes through the mounting holes 7 in the circuit board mounting seat 4 and are connected with the bulb copper head 15 and electrodes of the LED lamp base 13. The multiple LED members 2 are connected with each other, and are connected to the bulb copper head 15 of the LED lamp base 13 through the drive circuit 11. Then, the LED fixing cover 3 is mounted on the LED lamp base 13, so that the multiple LED members 2 are fixed in the positioning holes 8 of the LED fixing cover 3, thereby assembling the light emitting diode lamp as shown in FIG. 24 in accordance with the present invention. Thus, the light emitting diode lamp in accordance with the present invention may be available for the present filament bulb seat.

Figure 25:
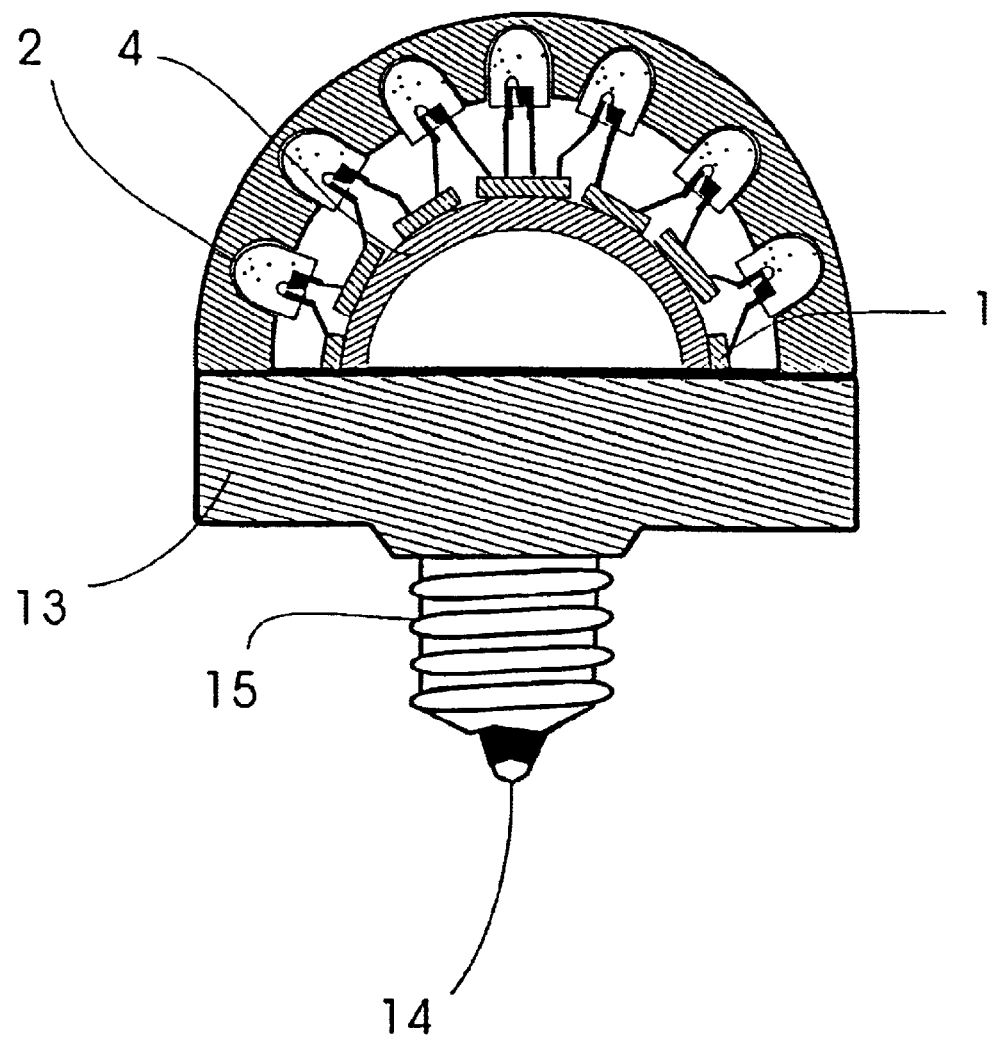
FIG. 25 is a side plan cross-sectional assembly view of the light emitting diode lamp in accordance with the present invention (the positioning hoes of the LED member is not penetrated).

FIG. 24 is a side plan cross-sectional assembly view of the light emitting diode lamp in accordance with the present invention (the positioning hoes of the LED member is penetrated). FIG. 25 is a side plan cross-sectional assembly view of the light emitting diode lamp in accordance with the present invention (the positioning hoes of the LED member is not penetrated).

Preferably, the LED fixing cover 3 is mounted above the multiple LED members 2 of the plane circuit board 1, for fixing the positions and projecting angles of the multiple LED members 2 of the plane circuit board 1, thereby enhancing the projecting angles and the illuminance of the light.

The multiple LED members 2 may be pulled to form after being soldered by a tin furnace automatically, without needing the manual soldering, thereby shortening the working time and cost of fabrication.

The multiple LED members 2 of the plane circuit board 1 may use any color and any LED seal package state member, such as SMD type, Lamp type or the like.

The multiple LED members 2 are arranged in the straddling or non-straddling cutting channels of the plane circuit board 1 in an annular manner.

The circuit board mounting seat 4 is made of material having a high heat conductive property, such as copper, aluminum or the like, thereby enhancing the heat dissipation efficiency, or made of insulating material having a high heat conductive property.

The multiple LED members 2 may form a convex arcuate face or press the plane circuit board 1 outward so that the plane circuit board 1 may form a spatial shape having a concave arcuate face, thereby forming a light emitting diode lamp that has a light gathering effect.

The plane circuit board 1 is cut to form a multiple-ring shape, including a helical and non-straddling shape as shown in FIGS. 3 and 4, a helical and straddling shape as shown in FIGS. 8 and 9, a concentric circle connected with multiple inclined sides as shown in FIGS. 13 and 14, or a concentric shape as shown in FIGS. 18 and 19.

The plane circuit board 1 may also be cut to form a multiple-square shape or a multiple-polygon shape, including a hexagonal shape or octagonal shape.

As shown in FIG. 25, the LED fixing cover 17 is made of a high light permeable material, such as PC, PMMA or the like, thereby increasing the illuminance of the light. In addition, the positioning holes of the LED fixing cover 17 are not penetrated.

Preferably, the LED fixing cover 3 and the LED lamp base 13 are made of waterproof material, thereby forming a waterproof a light emitting diode lamp.

The plane circuit board 1 may be a flexible circuit board.

Figure 23:
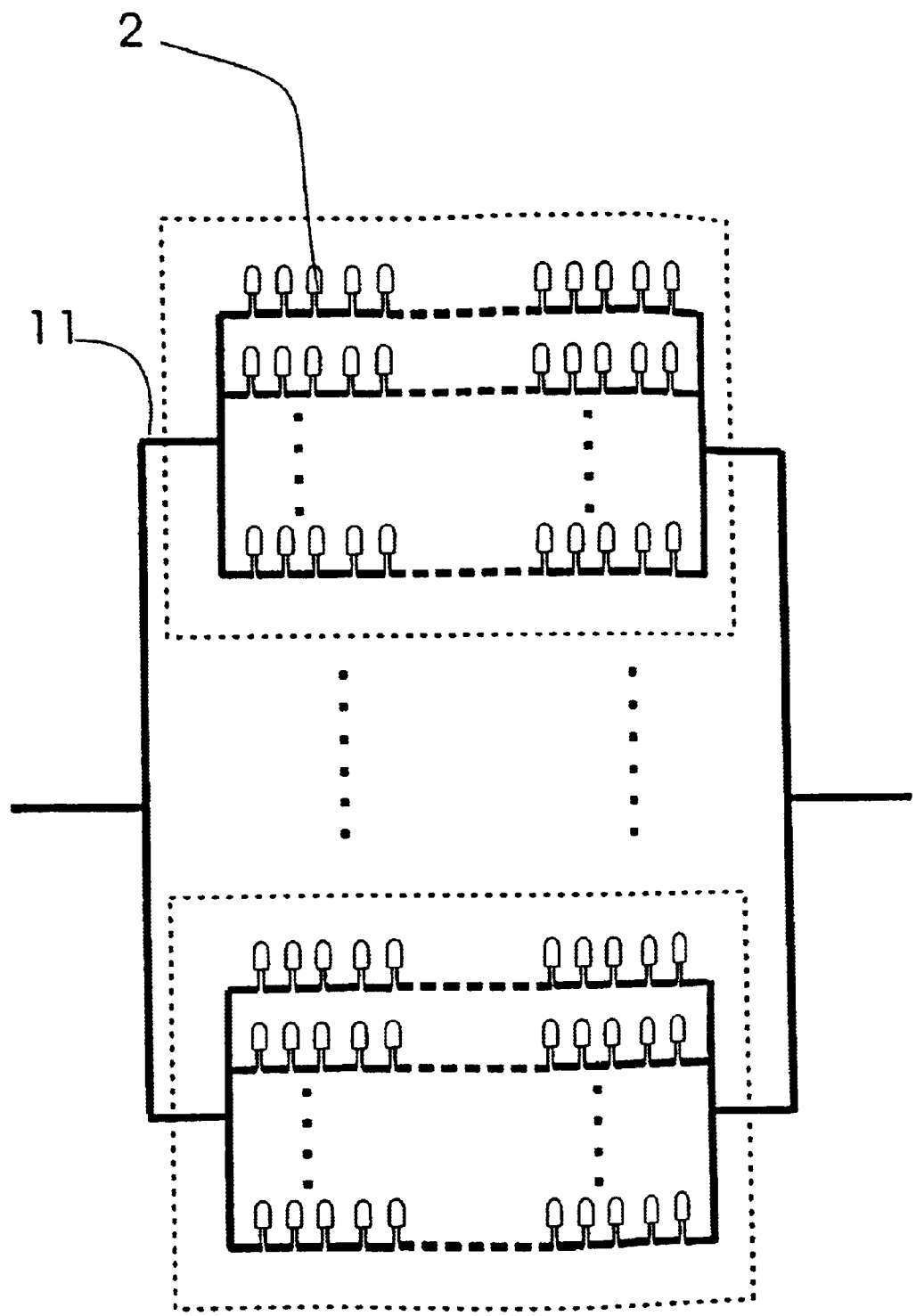
FIG. 23 is a circuit diagram of a light emitting diode lamp in accordance with the present invention.

The LED members 1 on the same ring are connected serially, and the LED members 1 on different rings are connected in parallel as shown in FIG. 23. The capacitors and resistors are mounted between the circuit board mounting seat 4 and the LED lamp base 13.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A light emitting diode lamp comprising:
   a plurality of LED members,
   a circuit board,
   an LED fixing cover,
   a circuit board mounting seat formed with a semi-hemispherical shape,
   a drive circuit, and
   an LED lamp base; wherein
      a spiraled slot is cut into said circuit board,
      said plurality of multiple LED members are mounted on said circuit board,
      said circuit board is mounted on said circuit board mounting seat so that said circuit board has a convex arcuate face,
      said plane circuit board and said circuit board mounting seat are mounted in said LED lamp base
      said plurality of LED members are electrically connected to each other and to said LED lamp base through said drive circuit, and
      said LED fixing cover is mounted on said LED lamp base above said plurality of LED members, such that said LED fixing cover fixes positions and projecting angles of said plurality of LED members on said circuit board.

2. The light emitting diode lamp in accordance with claim 1 wherein:
   said plurality of LED members are of the class of anyone of SMD type or lamp type.

3. The light emitting diode lamp in accordance with claim 1 wherein:
   said plurality of LED members are arranged in an annular manner about said spiraled slot in said circuit board.

4. The light emitting diode lamp in accordance with claim 1 wherein:
   said circuit board mounting seat is made of material having a high heat conductive property, as anyone of PC or PMMA.

5. The light emitting diode lamp in accordance with claim 1 wherein:
   said plurality of LED members forms a convex arcuate face so that said light emitting diode lamp has a light gathering effect.

6. The light emitting diode lamp in accordance with claim 1 wherein:
   said spiraled slot comprises multiple inclined sides.

7. The light emitting diode lamp in accordance with claim 1 wherein:
   said spiraled slot is formed as a multiple-polygon shape.

8. The light emitting diode lamp in accordance with claim 1 wherein:
   said LED fixing cover is made of a high light permeable material, as in anyone of PC or PMMA.

9. The light emitting diode lamp in accordance with claim 1 wherein:
   said LED fixing cover is formed with multiple positioning holes to receive said plurality of LED members, said positioning holes do not penetrate said LED fixing cover, and said LED fixing cover and said LED lamp base are made of waterproof material, such that said light emitting diode lamp is waterproof.

10. The light emitting diode lamp in accordance with claim 1 wherein:
    said circuit board mounting seat is made of insulating material with high heat conductivity.

* * * * *